US009435856B2

(12) United States Patent
Chen et al.

(10) Patent No.: US 9,435,856 B2
(45) Date of Patent: Sep. 6, 2016

(54) POSITION ADJUSTABLE PROBING DEVICE AND PROBE CARD ASSEMBLY USING THE SAME

(71) Applicant: MPI CORPORATION, Chu-Pei, Hsinchu Shien (TW)

(72) Inventors: Tsung-Yi Chen, Chu-Pei (TW); Chung-Tse Lee, Chu-Pei (TW); Shih-Shin Chen, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 177 days.

(21) Appl. No.: 14/253,336

(22) Filed: Apr. 15, 2014

(65) Prior Publication Data

US 2014/0306729 A1    Oct. 16, 2014

(30) Foreign Application Priority Data

Apr. 16, 2013   (TW) .............................. 102113400 A
Apr. 16, 2013   (TW) .............................. 102206910 U
Apr. 16, 2013   (TW) .............................. 102206911 U
Jul. 26, 2013   (TW) .............................. 102214129 U

(51) Int. Cl.
  *G01R 31/01*    (2006.01)
  *G01R 31/28*    (2006.01)
  *G01R 1/073*    (2006.01)

(52) U.S. Cl.
  CPC ....... *G01R 31/2889* (2013.01); *G01R 1/07378* (2013.01)

(58) Field of Classification Search
  CPC .......... G01R 31/2889; G01R 31/2887; G01R 31/2886; G01R 1/07378; G01R 1/06705

USPC ................. 324/750.22, 754.01–754.03, 755, 324/762.01–762.1, 750.16
See application file for complete search history.

(56) References Cited

U.S. PATENT DOCUMENTS

| | | | | |
|---|---|---|---|---|
| 6,966,783 B2 * | 11/2005 | Hachuda | ............ | G01R 1/06722 439/66 |
| 7,180,318 B1 * | 2/2007 | Mahoney | ............ | G01R 1/07314 324/756.03 |
| 2009/0184727 A1 * | 7/2009 | Kim | .................... | G01R 1/07378 324/754.07 |
| 2009/0260459 A1 * | 10/2009 | Kim | .................... | G01R 1/07307 73/866.5 |
| 2010/0001752 A1 * | 1/2010 | Yamada | ............. | G01R 31/2891 324/756.01 |
| 2012/0286817 A1 * | 11/2012 | Duckworth | ........ | G01R 1/06738 324/755.01 |

FOREIGN PATENT DOCUMENTS

| TW | M366073 U | 10/2009 |
|---|---|---|
| TW | M385788 U | 8/2010 |

* cited by examiner

*Primary Examiner* — Tung X Nguyen
*Assistant Examiner* — Dominic Hawkins
(74) *Attorney, Agent, or Firm* — Muncy, Geissler, Olds & Lowe, P.C.

(57) ABSTRACT

A position adjustable probing device adapted for being mounted to a circuit board includes a frame, a probe head, a space transformer module and an elevation adjusting structure. The frame has a first surface, a second surface opposite to the first surface, and a first opening penetrating through the first and second surfaces. The probe head is coupled to the frame. The space transformer module is disposed in the first opening. The elevation adjusting structure is provided at the frame and has a plurality of spacers for adjusting a position of the frame relative to a reference surface in a vertical direction.

16 Claims, 14 Drawing Sheets

POSITION ADJUSTABLE PROBING DEVICE AND PROBE CARD ASSEMBLY USING THE SAME

CROSS-REFERENCE TO RELATED APPLICATIONS

This application claims priorities from Taiwan Patent Application Nos. 102113400, 102206910 and 102206911 filed on Apr. 16, 2013 and Taiwan Patent Application No. 102214129 filed on Jul. 26, 2013, the entire contents of which are incorporated herein by reference.

BACKGROUND OF THE INVENTION

1. Field of the Invention

The present invention relates generally to position adjusting mechanisms used in probe cards and more particularly, to a position adjustable probing device and a probe card assembly using the same.

2. Description of the Related Art

It is well-known that a device under test (hereinafter referred to as "DUT"), such as a die on a wafer, is indirectly contacted with a testing apparatus through a probe card. By means of signal transmission and analysis, electric characteristics of the DUT can be obtained. The conventional probe card generally comprises fine probe needles arranged in a desired manner that each probe needle corresponds in location to a predetermined contact, such as pad or bump, of the DUT, such that the probe needles can positively transmit testing signals from the testing apparatus to the DUT when contacting the corresponding contacts of the DUT. The electric characteristics of the DUT can be thus measured by running control and analysis procedures of the probe card and the testing apparatus.

FIG. 1 shows a conventional probe card according to a prior art. The conventional probe card is formed by bonding a probe head 10, a space transforming substrate 11 and a circuit board 12 together by soldering. It is found that the probe head 10, space transforming substrate 11, or the circuit board 12 will be easily damaged due to the processing error or mistake in soldering. The conventional probe card may undergo a desoldering process when it is malfunction and needs to be repaired. However, performing desoldering process will have a great risk of damaging the circuit board 12, the space transforming substrate 11 or the probe head 10.

To solve the problems of the above-mentioned conventional probe card, a probe card formed by combinedly and detachably assembling the probe head, space transforming substrate and the circuit board together is developed in lieu of the probe card assembled by soldering. Such combination-type probe card can be seen in Taiwan Patent Publication Nos. M385788 and M366073. However, because of lack of any position adjusting mechanism in these probe cards disclosed in aforesaid patents, the mismatch in position resulted from assembly errors can not be adjusted and compensated. In other words, these probe cards disclosed in aforesaid patents may encounter a problem of position adjustment which needs to be further improved.

In light of above, it is desired to develop a position adjustable probing device to improve the disadvantages of the probe cards mentioned above.

SUMMARY OF THE INVENTION

The present invention has been accomplished in view of the above-noted circumstances. It is an objective of the present invention to provide a position adjustable probing device having an elevation adjusting structure for adjusting the height of the transforming substrate relative to the circuit board of a probe card assembly for facilitating alignment and assembly between the circuit board and the transforming substrate.

It is another objective of the present invention to provide a position adjustable probing device, which utilizes a planimetric position adjusting structure to adjust the position of the transforming substrate on a plane for enabling the pads of the transforming substrate to be positively contacted with the electric contacts of a circuit board, thereby enhancing the assembly accuracy of the probing device and the flexibility of position adjustment.

It is still another objective of the present invention to provide a position adjustable probing device, which utilizes a needle position adjusting structure to adjust the position of the probe head of the probing device for enabling the tails of the probe needles of the probe head to be positively contacted with the pads of the transforming substrate, thereby enhancing the assembly accuracy and the flexibility of position adjustment of the probe head.

It is still another objective of the present invention to provide a probe card assembly, which utilizes an elevation adjusting structure to adjust the height of a frame relative to a circuit board, and a needle position adjusting structure to adjust the height of a probe head relative to the frame.

It is still another objective of the present invention to provide a position adjustable probing device and a probe card assembly using the position adjustable probing device, which can save time in assembly or disassembly and have the advantage of convenience in dismantling because parts thereof need not to be orderly aligned one after another and assembled on or disassembled from a circuit board.

In an embodiment of the present invention, a position adjustable probing device for being mounted to a circuit board is provided comprising a frame, a probe head, a space transformer module and an elevation adjusting structure. The frame has a first surface, a second surface opposite to the first surface, and a first opening penetrating through the first and second surfaces. The probe head is coupled to the frame. The elevation adjusting structure is provided at the frame and has a plurality of spacers for adjusting a position of the frame relative to a surface of the circuit board in an axial direction. The space transformer module is disposed in the first opening of the frame and electrically connected with the probe head and the circuit board in a way that the second surface of the frame faces the circuit board and the first surface faces the probe head.

In an embodiment of the present invention, the space transformer module comprises a substrate frame, a transforming substrate disposed inside the substrate frame, and a planimetric position adjusting structure for adjusting a position of the transforming substrate on a plane.

In an embodiment of the present invention, the probing device further comprises a needle position adjusting structure provided at the frame and coupled to the probe head for adjusting a position of the probe head.

In an embodiment of the present invention, the probing device comprises an elevation adjusting structure having a plurality of spacers disposed between the frame and the circuit board for adjusting a height of the frame relative to the circuit board, and a needle position adjusting structure having a plurality of spacers disposed between the frame and the probe head for adjusting a height of the probe head relative to the frame.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The present invention is to disclose a position adjustable probing device for testing semiconductor chips or photoelectric components. Since the principle of use and basic function of the probe card are well known for a person skilled in the art, the detailed description thereof will not be positively recited thereunder for purpose of concise illustration. Further, it is to be understood that the drawings disclosed in the present invention are given by way of schematically illustrating the structural features of the present invention only; therefore, they are not, or need not to be, sketched according to actual dimension in detail.

Figure 1:
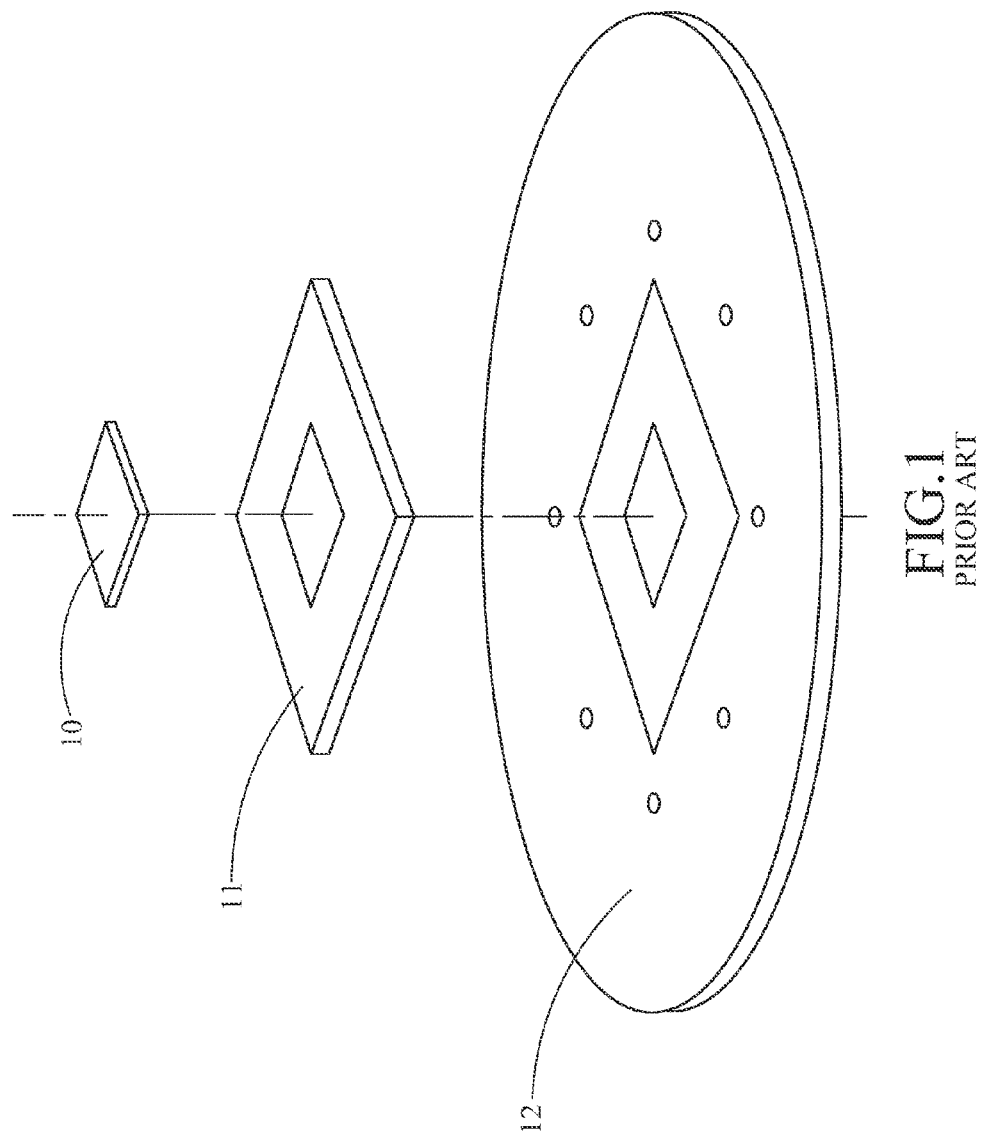
FIG. 1 is a schematic perspective view of a probe card according to a prior art.
Figure 2A:
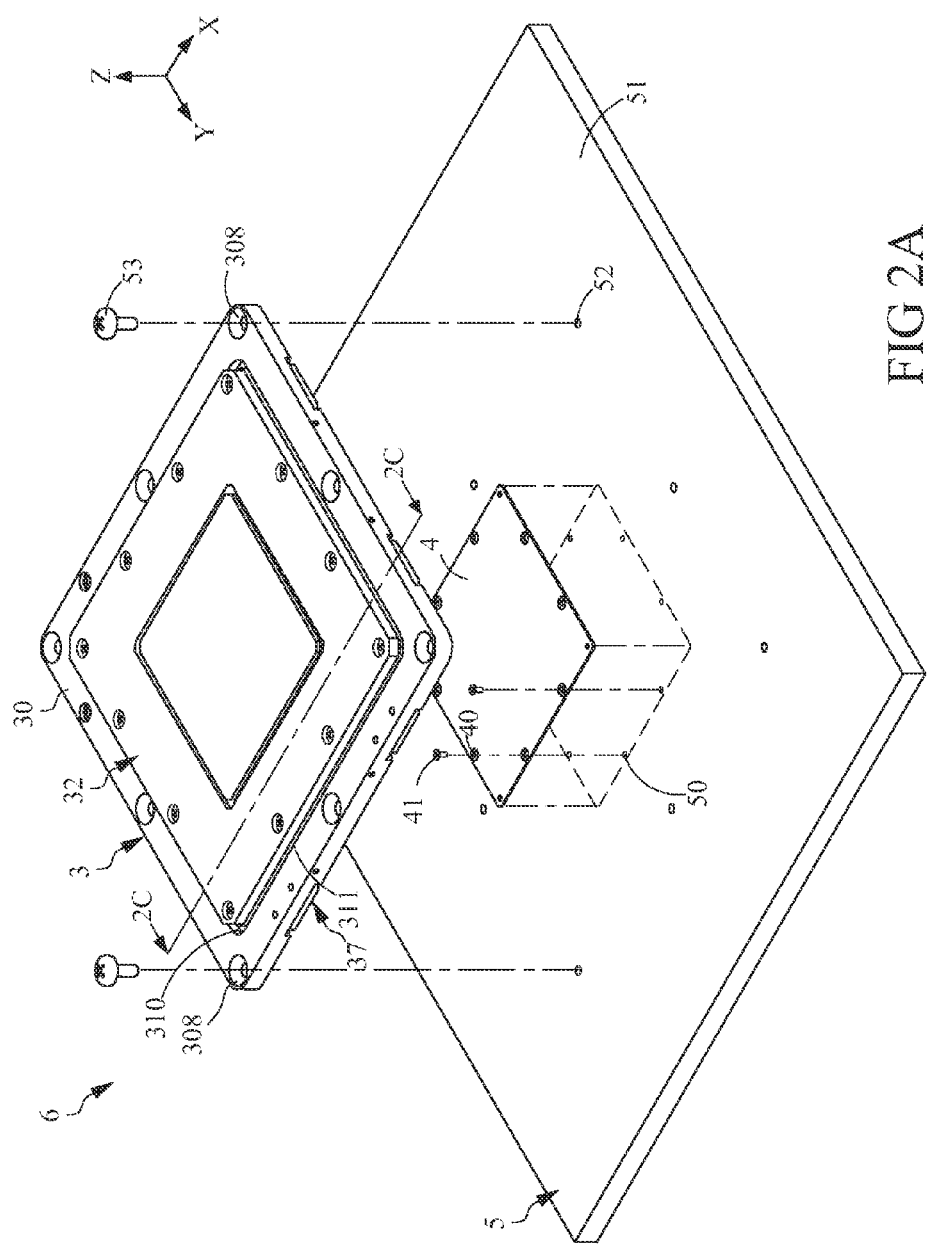
FIG. 2A is a schematic perspective view showing a position adjustable probing device according to an embodiment of the present invention, an electrically conductive layer and a circuit board.
Figure 2B:
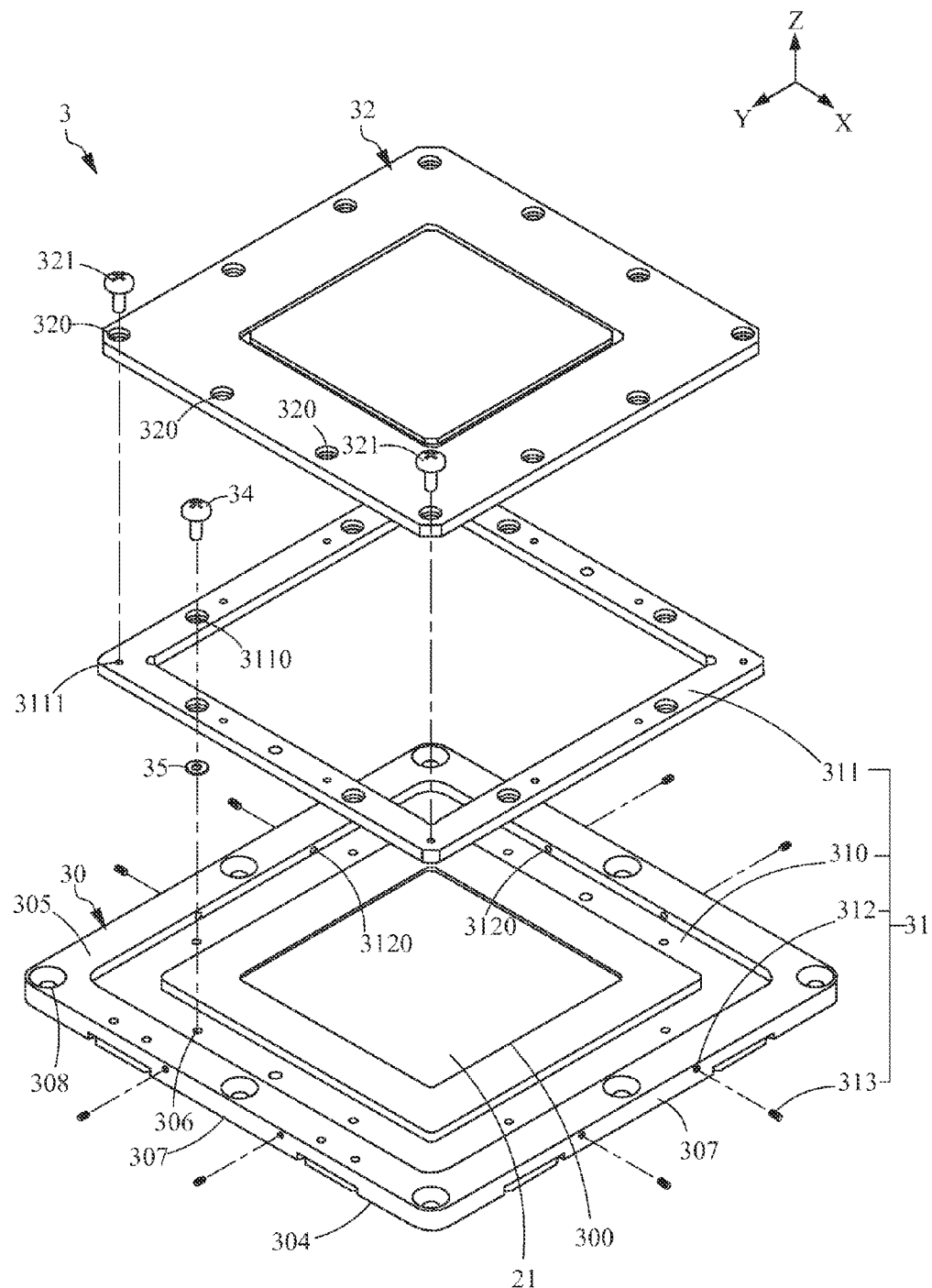
FIG. 2B is a schematically exploded view showing the position adjustable probing device according to the embodiment of the present invention.
Figure 2C:
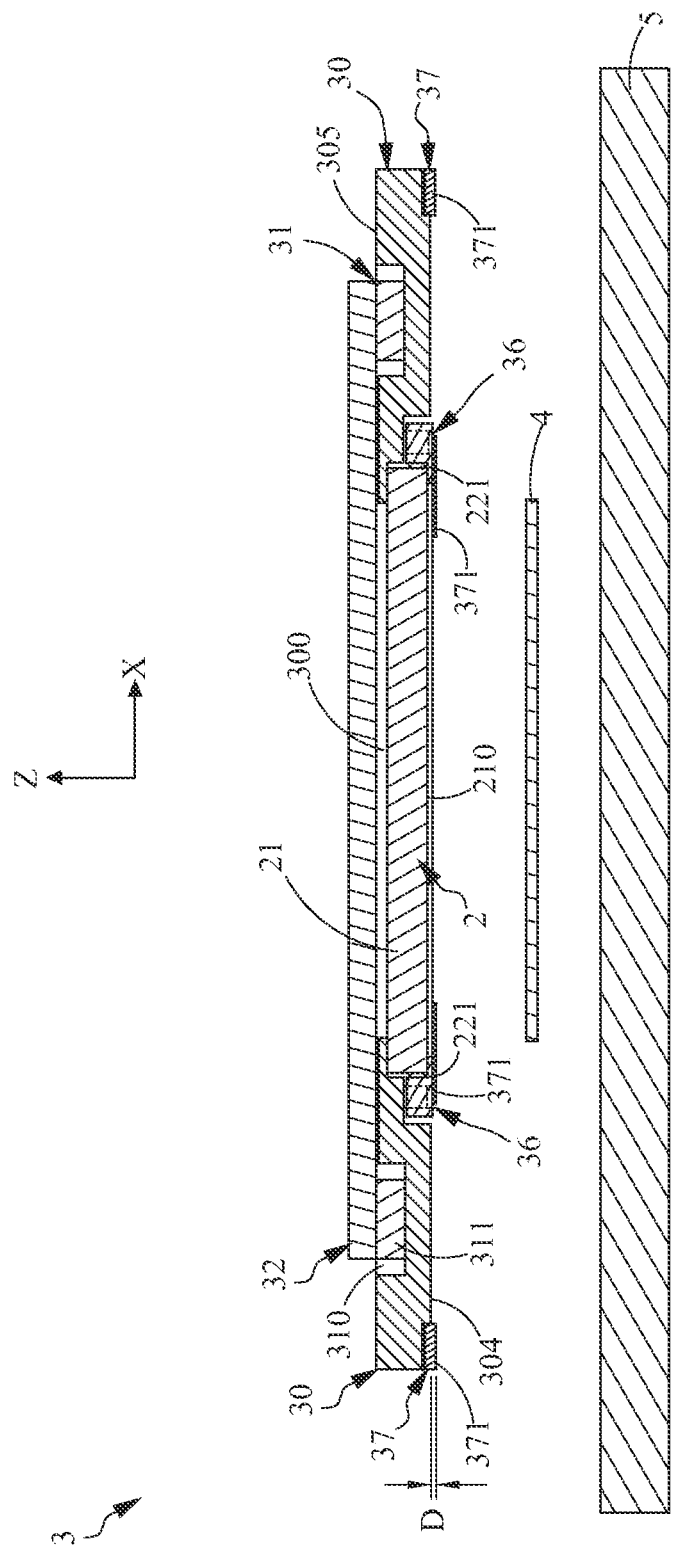
FIG. 2C is a schematically sectional view taken along the line 2C-2C of FIG. 2A.

FIG. 2A shows a position adjustable probing device according to an embodiment of the present invention, FIG. 2B shows the position adjustable probing device of the embodiment of the present invention in an exploded manner, and FIG. 2C is a schematically sectional view of FIG. 2A. The probing device defined in the present invention indicates a probe card, such as a vertical probe card (VPC). In this embodiment of the present invention, the probing device 6 comprises a space transformer module 2, a support frame 30, a needle position adjusting structure 31, a probe head 32, a clamp adjusting structure 36, and an elevation adjusting structure 37. The support frame 30 is adapted to support the space transformer module 2 and be coupled with the probe head 32, such that the support frame 30, the space transformer module 2 and the probe head 32 combinedly form a space transformer and probe head module 3. The space transformer and probe head module 3 is electrically connected with a circuit board 5 through an electrically conductive layer 4 so as to form a probe card assembly. It is to be mentioned that the electrically conductive layer 4 may be installed on the space transformer and probe head module 3 in advance, and then the space transformer and probe head module 3 is mounted to the circuit board 5 so as to achieve electric connection between the space transformer and probe head module 3 and the circuit board 5. Alternatively, in another embodiment of the present invention, the electrically conductive layer 4 may be mounted to the circuit board 5 in advance, and then the electric connection between the space transformer and probe head module 3 and the circuit board 5 can be done by mounting the space transformer and probe head module 3 to the circuit board 5. In this embodiment, the electrically conductive layer 4 is mounted to the circuit board 5 by fasteners 41 that pass through the through holes 40 of the electrically conductive layer 4 and are threaded into the threaded holes 50 of the circuit board 5, respectively. Thereafter, the space transformer and probe head module 3 is mounted to the circuit board 5 for enabling the transforming substrate 21 of the space transformer module 2 to be electrically coupled with the electrically conductive layer 4, such that the transforming substrate 21 is electrically connected with the circuit board 5 through the electrically conductive layer 4. When the space transformer and probe head module 3 is mounted on the circuit board 5, fasteners 53 passing through the through holes 308 of the support frame 30 are threaded into threaded holes 52 of the circuit board 5, such that the space transformer and probe head module 3 is fixedly fastened to the circuit board 5. It is to be understood that the way of fastening the space transformer and probe head module 3 to the circuit board 5 disclosed in this embodiment is a well-known prior art, and the fastening way is not limited to the one disclosed in this embodiment.

As shown in FIG. 2B, the support frame 30 has a first surface 305, a second surface 304 opposite to the first surface 305, and a first opening 300 penetrating through the first and second surfaces 305 and 304. On the first surface 305 of the support frame 30, the needle position adjusting structure 31 is provided and connected with the probe head 32 for adjusting the position of the probe head 32 on the XY plane for enabling the tails (not shown) of the probe needles (not shown) of the probe head 32 to be respectively and positively aligned and contacted with the pads (not shown) of the transforming substrate 21 of the space transformer module 2, thereby enhancing the assembly accuracy and the flexibility of position adjustment of the probe head 32.

In this embodiment of the present invention, the needle position adjusting structure 31 comprises an adjusting groove 310, a mounting member 311, a plurality of first positioning threaded holes 312, and a plurality of first positioning screws 313. The adjusting groove 310 is recessed on the first surface 305 of the support frame 30 and has a predetermined depth. The mounting member 311 having a predetermined thickness is slightly moveably fixed in the adjusting groove 310 and coupled with the probe head 32. The thickness of the mounting member 311 is, but not limited to be, greater than the depth of the adjusting groove 310. Further, the mounting member 311 may have a polygonal shape, such as a rectangular shape or hexagonal shape, or may be an arc-shaped frame, such as circle frame or oval frame. The adjusting groove 310 may be configured having a shape corresponding to that of the mounting member 311 in such a way that the mounting member 311 is moveably received in the adjusting groove 310. In this embodiment of the present invention, the mounting member 311 is a rectangular frame having a profile corresponding to the configuration of the adjusting groove 310. In other words, the adjusting groove 310 is a rectangular frame-like groove having a configuration corresponding to the configuration of the mounting member 311.

In this embodiment, the mounting member 311 is provided with a plurality of through holes 3110 each having a counterbore construction, and the bottom surface of the adjusting groove 310 is provided with a plurality of threaded holes 306 aligned with the through holes 3110, respectively. By means of screws 34 that pass through the through holes 3110 and are engaged with the threaded holes 306 respectively, the mounting member 311 can be fixedly mounted in the adjusting groove 310. Further, the probe head 32 is also provided with a plurality of through holes 320 each having a counterbore construction, and the mounting member 311 is provided with a plurality of threaded holes 3111 aligned with the through holes 320, respectively. By means of screws 321 that pass through the through holes 320 and are engaged with the threaded holes 3111 respectively, the probe head 32 can be fixedly mounted to the mounting member 311, such that the probe needles of the probe head 32 can be electrically connected with the pads of the transforming substrate 21. The probe head 32 may be, but not limited to, a vertical probe head used in a vertical probe card. Any suitable probe head may be used subject to actual need.

In another embodiment of the present invention, the mounting member 311 may be provided with a plurality of through holes, the probe head 32 may be provided with a plurality of through holes each having a counterbore construction and corresponding to one of the through hole of the mounting member 311, and the bottom surface of the adjusting groove 310 may be provided with a plurality of threaded holes 306 aligned with the through holes of the mounting member 311 and the through holes of the probe head 32, respectively. By means of screws that pass through the through holes of the probe head 32 and the through holes of the mounting member 311 and are engaged with the threaded holes 306 respectively, the probe head 32 and the mounting member 311 can be fixedly mounted in the adjusting groove 310, and at the same time the probe head 32 is mounted on the mounting member 311 for enabling the probe needles of the probe head 32 to be electrically contacted with the pads of the transforming substrate 21.

By means of the cooperation of the first positioning screws 313 and the first positioning threaded holes 312 of the needle position adjusting structure 31, the user can adjust the position of the mounting member 311 on an XY plane so as to further adjust the position of the probe head 32 on an XY plane. In other words, by means of turning the first positioning screws 313 respectively engaged in the first positioning threaded holes 312, the position of the probe head 32 on the XY plane can be adjusted. In this embodiment of the present invention, each of the four side members of the support frame 30 is provided with two first positioning threaded holes 312 each extending from an outer periphery 307 of the support frame 30 to the adjusting groove 310 such that each first positioning threaded hole 312 has an opening 3120 on a periphery wall of the adjusting groove 310 in communication with the adjusting groove 310. It is to be understood that the amount of the first positioning threaded holes 312 at each side member of the support frame 30 is determined subject to actual need, and is not limited to the design disclosed in the embodiment of the present invention. The first positioning screws 313 are respectively engaged in the first positioning threaded holes 312 in such a way that each first positioning screw 313 has an end extending out of one opening 3120 and being stopped at a lateral side of the mounting member 311. Specifically speaking, by means of adjusting the positions of the first positioning screws 313, the mounting member 311 is moveable on the bottom surface of the adjusting groove 310 in X-axis and/or Y-axis of the XY plane.

The needle position adjusting structure 31 further comprises a plurality of spacers 35, which are adapted for adjusting the position of the mounting member 311 in the adjusting groove 310 in Z-axis direction so as to adjust, in turn, the position of the probe head 32 in the Z-axis direction. As a result, the needle position adjusting structure 31 has a function of adjusting the position of the probe head 32 in X-axis and/or Y-axis of XY plane by the structural features illustrated in the preceding paragraphs, and another function of adjusting the position of the probe head 32 in Z-axis direction by the spacers 35. In this embodiment of the present invention, the spacers 35 are realized as washers through which the screws 34 pass respectively, so that the spacers 35 are fixedly held between the mounting member 311 and the bottom surface of the adjusting groove 310, i.e. between the probe head 32 and the support frame 30. As to the amount and thickness of the spacers 35, they may be determined subject to the desired height to be adjusted, and are not limited to the disclosure of this embodiment. These spacers 35 serve as an elevation adjusting structure of the probe head 32, and are not limited to the circular shape disclosed in this embodiment.

Figure 2D:
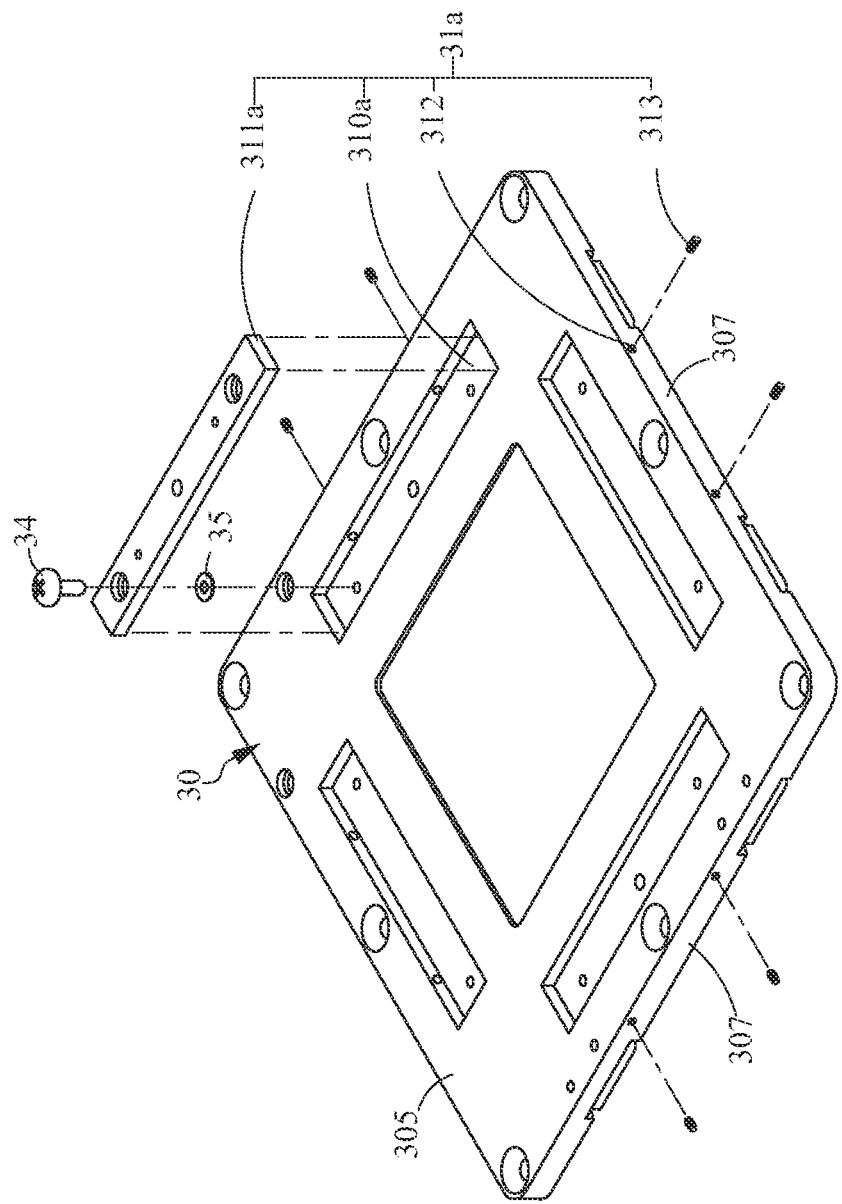
FIG. 2D is a schematic perspective view showing the support frame and a needle position adjusting structure according to another embodiment.

FIG. 2D shows a needle position adjusting structure in accordance with another embodiment of the present invention. In this embodiment, the needle position adjusting structure 31a comprises a plurality of adjusting grooves 310a recessed on the first surface 305 of the support frame 30, a plurality of mounting members 311a respectively mounted in the adjusting grooves 310a and connected with the probe head 32, a plurality of first positioning threaded holes 312, and a plurality of first positioning screws 313. The support frame 30 has four side members, each of which is provided with at least one adjusting groove 310a and associated mounting member 311a. Each adjusting groove 310a is a rectangular groove receiving therein an associated rectangular mounting member 311a. The first positioning threaded holes 312 are provided at four side members of the support frame 30 respectively, and configured transversely extending from an outer periphery 307 of the support frame 30 to the respective adjusting groove 310a such that each first positioning threaded hole 312 is communicated with a respective adjusting groove 310a. The first positioning screws 313 are respectively engaged in the first positioning threaded holes 312 in such a way that each first positioning screw 313 has an end stopped at a lateral side of a respective mounting member 311a. In this embodiment, two pairs of first positioning threaded hole 312 and first positioning screw 313 are provided at each of the four side members of the support frame 30. It is to be mentioned that the configuration of the mounting member 311 or 311a is designed according to the configuration of the probe head, and is not limited to the one disclosed in this embodiment. Further, the shape of the adjusting groove 310 or 310a is not limited to a rectangular one. The adjusting groove 310 or 310a may be designed having a polygonal or circular shape based on an actual need. Furthermore, the mount of the paired first positioning threaded hole 312 and positioning screw 313 may be determined according to the actual need, and is not limited to the design disclosed in this embodiment.

Figure 3:
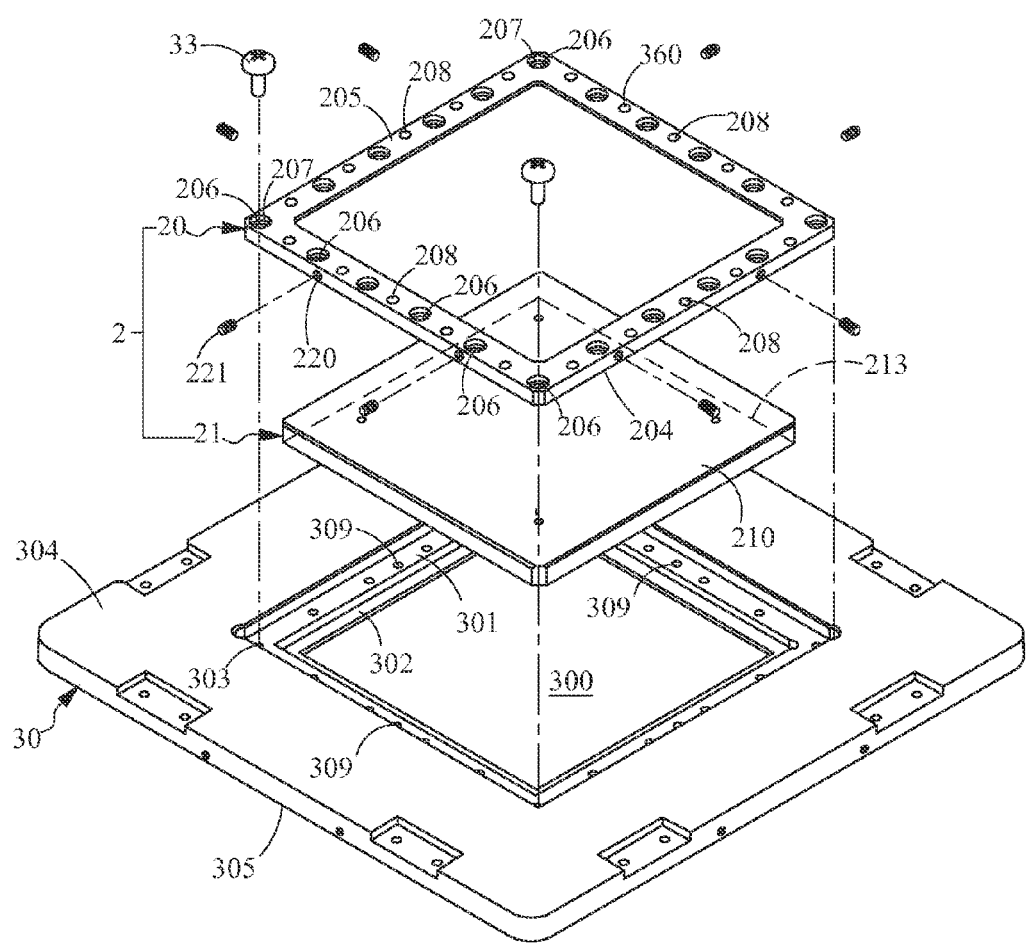
FIG. 3 is a schematically exploded view showing the support frame and a space transformer module of the present invention.

FIG. 3 shows the support frame 30 and the space transformer module 2 according to an embodiment of the present invention. Referring to FIG. 3 and FIG. 4B, the support frame 30 has a first surface 305, a second surface 304 opposite to the first surface 305, and a first opening 300 penetrating through the first and second surfaces 305 and 304 for receiving therein the space transformer module 2. The support frame 30 further includes a first support flange 301 extending from an inner periphery wall that surrounds around the first opening 300, and a second support flange 302 extending from an inner periphery wall of the first support flange 301 that corresponds to the first opening 300. The second substrate surface 213 of the transforming substrate 21 of the space transformer module 2 is supported on the second support flange 302 when the space transformer module 2 is mounted to the support frame 30.

Referring to FIG. 3 and FIG. 2B, the space transformer and probe head module 3 further comprises a plurality of fastening screws 33. The substrate frame 20 has a plurality of second through holes 206 penetrating through the third surface 204 and the fourth surface 205 of the substrate frame 20. The first support flange 301 is provided with a plurality of second threaded holes 303 respectively aligned with the second through holes 206. The fastening screws 33 are respectively threaded into the second threaded holes 303 through the second through holes 206 for fixedly fastening the substrate frame 20 to the support frame 30. It is to be mentioned that because a counterbore 207 is provided in communication with the second through hole 206, the head of the fastening screw 33 will be totally received in the counterbore 207 without protruding out of the fourth surface 205 when the fastening screw 33 is used to fasten the substrate frame 20 to the support frame 30.

Figure 4A:
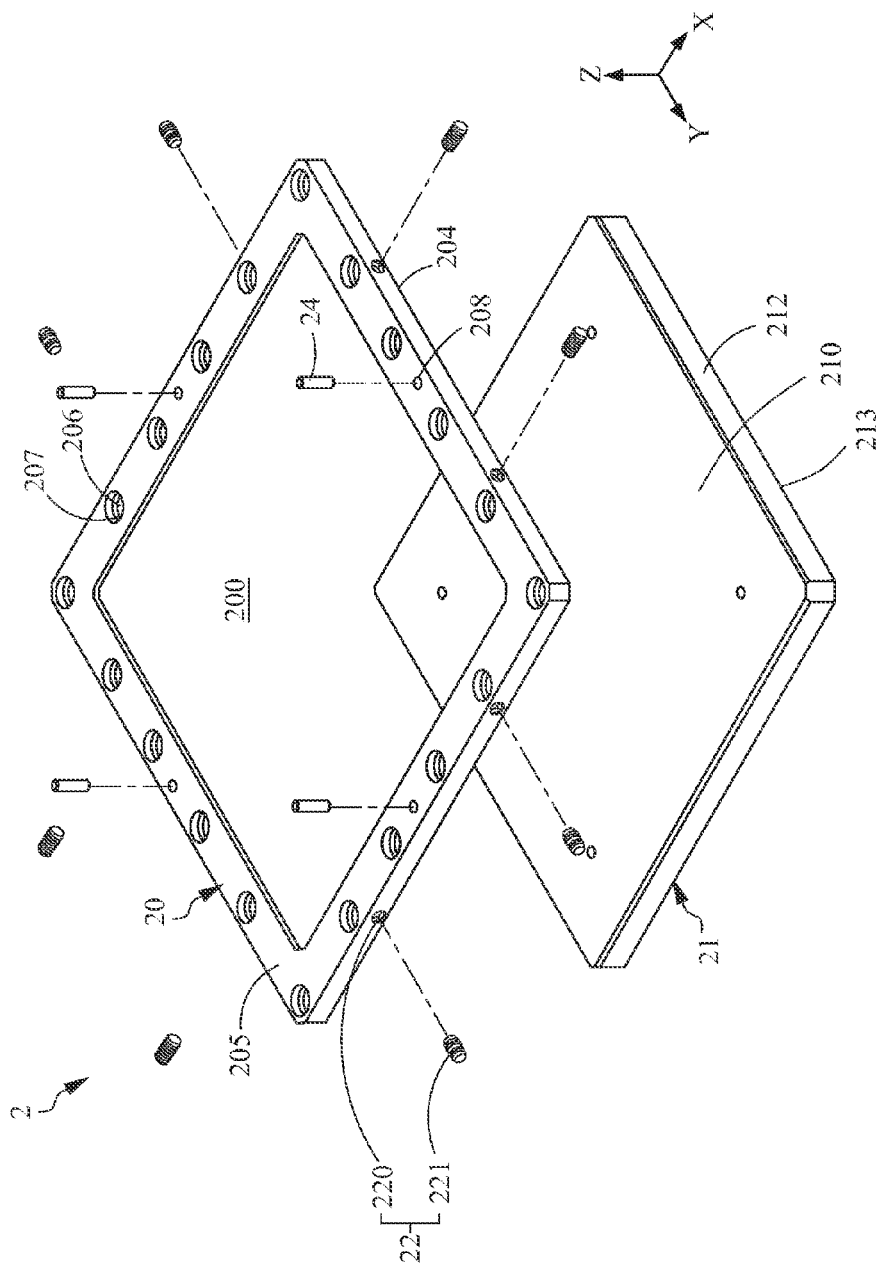
FIG. 4A is a schematically exploded view of the space transformer module of the present invention.
Figure 4B:
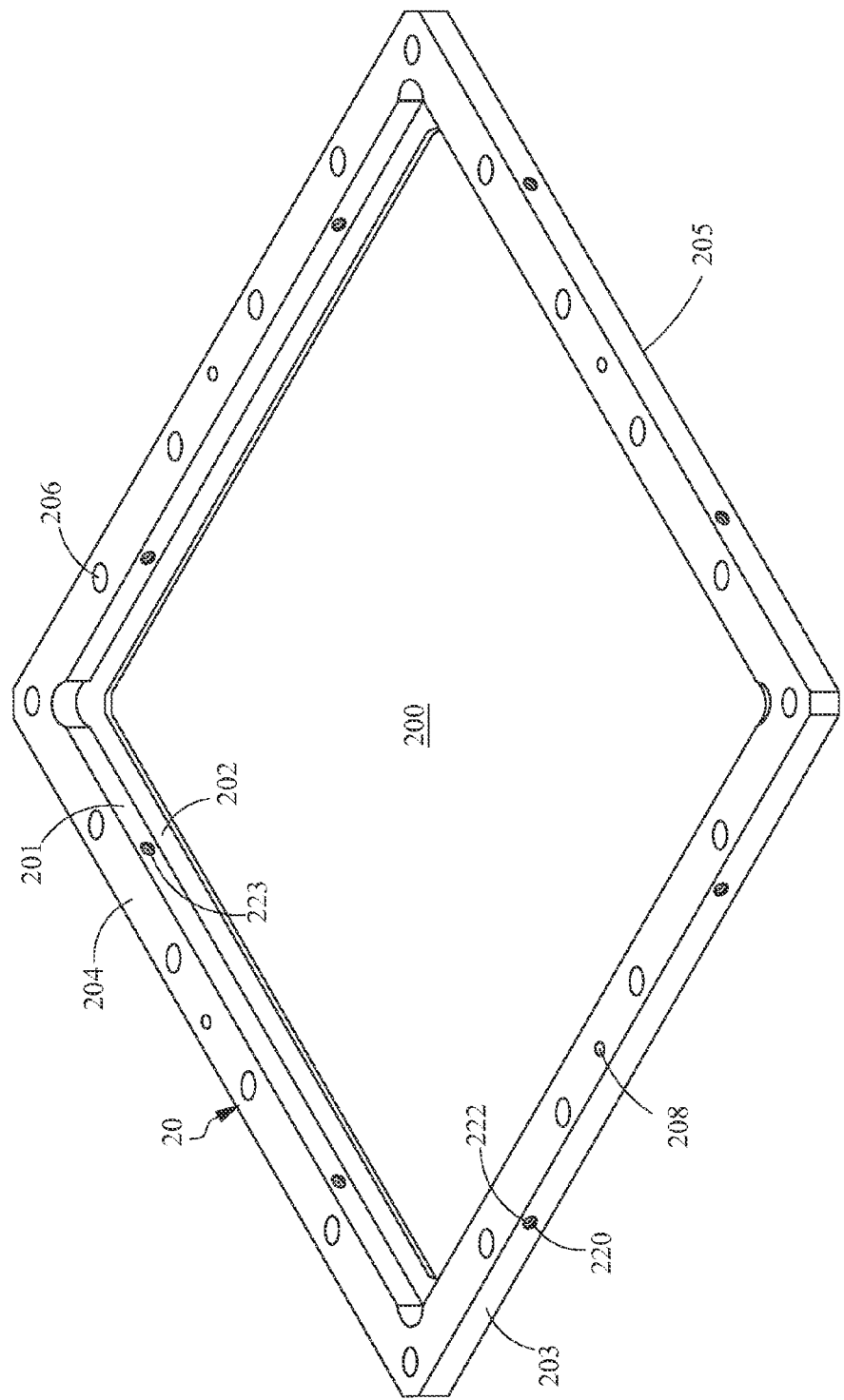
FIG. 4B is a schematic perspective view of the substrate frame shown in FIG. 4A but viewed from another angle.

The space transformer module 2 will be detailed illustrated hereunder by reference to FIG. 4A which is a schematically exploded view of the space transformer module of the present invention, and FIG. 4B which is a schematic perspective view of the substrate frame. In this embodiment of the present invention, the space transformer module 2 comprises primarily a substrate frame 20, a transforming substrate 21 and a planimetric position adjusting structure 22. The substrate frame 20 includes a second opening 200 and a third support flange 202 extending from an inner periphery wall 201 that surrounds around the second opening 200 towards a center of the second opening 200. In this embodiment, the substrate frame 20 has a third surface 204 and a fourth surface 205 opposite to the first surface 204. The third support flange 202 is configured to integrally and smoothly extend from the fourth surface 205 towards the center of the second opening 200; however, the structure of the third support flange 202 is not limited to this design. For example, in another embodiment of the present invention, the third support flange 202 may extend from a location of the inner periphery wall 201 between the third surface 204 and the fourth surface 205 towards the center of the second opening 200. Further, in this embodiment, the substrate frame 20 is a rectangular frame. It is to be mentioned that the configuration of the substrate frame 20 can be designed subject to the actual requirement of user; therefore, it is not limited to a rectangular one. For example, circular frame, oval frame, or polygonal frame may be used as the substrate frame 20 of the present invention. Furthermore, the substrate frame 20 has a plurality of second through holes 206 each penetrating through the third surface 204 and the corresponding fourth surface 205. Counterbores 207 are formed on the fourth surface 205, and each counterbore 207 is communicated with one of the second through holes 206.

Referring to FIGS. 4A, 4B and 3 again, the transforming substrate 21 has a first substrate surface 210 abutted at the substrate frame 20, and a second substrate surface 213 opposite to the first substrate surface 210 and abutted at the support frame 30. Specifically speaking, the transforming substrate 21 is received in the second opening 200 with the first substrate surface 210 supported on the third support flange 202. The probe head 32 has a plurality of probe needles (not shown) corresponding to and being electrically connected with the pads on the second substrate surface 213 of the transforming substrate 21 through the first opening 300. The first substrate surface 210 of the transforming substrate 21 is electrically connected with a circuit board 5. Alternatively, in another embodiment of the present invention, an electrically conductive layer 4 is coupled between the first substrate surface 210 and the circuit board 5.

In this embodiment, the transforming substrate 21 is a space transformer. That is, pads on the first substrate surface 210 of the transforming substrate 21 and pads on the second substrate surface 213 are respectively and electrically connected together and have however different distribution and density. The distribution and density of the pads on both surfaces of the transforming substrate 21 are not specifically limited. Nevertheless, the distribution and density of these pads are normally designed subject to the type and requirement of devices under test. Since the mechanism of space transformer used in probe card is well known for a person skill in the art, the detailed discussion thereof needs not to be described herein. For the transforming substrate 21, a single substrate is used in this embodiment; however, a multi-layered ceramic (MLC) member, a multi-layered organic (MLO) member, or a multi-layered silicon member may be used. In another embodiment of the present invention, the transforming substrate 21 may be composed of a combination of a multi-layered ceramic member and a multi-layered organic member, or a combination of a multi-layered ceramic (MLC) member and a flexible printed circuit board (FPCB).

The planimetric position adjusting structure 22 is provided at the substrate frame 20 and works on the transforming substrate 21 for adjusting the position of the transforming substrate 21 on a plane which is defined as the XY plane in this embodiment. In other words, the planimetric position adjusting structure 22 can drive the transforming substrate 21 to move in X-axis and/or Y-axis direction so as to adjust the position of the transforming substrate 21 on the XY plane. Specifically speaking, when the transforming substrate 21 is mounted to the substrate frame 20, a rough alignment of the transforming substrate 21 to restrict the transforming substrate 21 in an initial position is done. Thereafter, the planimetric position adjusting structure 22 is operated to fine tune the transforming substrate 21 to a desired position. In this embodiment, the planimetric position adjusting structure 22 comprises a plurality of second positioning threaded holes 220 and a plurality of second positioning screws 221. The second positioning threaded holes 220 are provided at the substrate frame 20 in a way that each second positioning threaded hole 220 penetrates through the substrate frame 20 from an outer periphery wall 203 to the inner periphery wall 201, such that each second positioning threaded hole 220 has an opening 223 on the inner periphery wall 201 in communication with the second opening 200, and an opening 222 on the outer periphery wall 203. The second positioning screws 221 are screwingly threaded into the second positioning threaded holes 220, respectively. Each second positioning screw 221 has an end passing through the opening 223 on the inner periphery wall 201 and being firmly stopped at a lateral side 212 of the transforming substrate 21. In this embodiment, the planimetric position adjusting structure 22 has a plurality of positioning structure units, provided that one second positioning screw 221 and one associated second positioning threaded hole 220 combinedly serve as a unit of positioning structure. Further, the substrate frame 20 is a rectangular frame having perpendicularly connected four side members, and each side member is equipped with two units of positioning structure. However, it is to be mentioned that the number of the positioning structure units provided at each side member of the substrate frame 20 is not limited to two. Based on the dimension of the transforming substrate 21 used and the desired adjusting effect required, one or more positioning structure units may be properly provided at each side member of the substrate frame 20.

Referring to FIGS. 4A, 4B and 2A again, by means of the planimetric position adjusting structure 22, the position of the transforming substrate 21 inside the substrate frame 20 can be adjusted so as to accurately position the pads of the transforming substrate 21 for facilitating assembly of the transforming substrate 21 with the electrically conductive layer 4 of a probe card. By means of adjusting the position of the transforming substrate 21 via the planimetric position adjusting structure 22, the pads of the transforming substrate 21 are electrically connected with the electric contacts of the circuit board 5 through the electrically conductive layer 4. It is to be specially mentioned that the planimetric position adjusting structure 22 may be provided at the support frame 30 in another embodiment. In this case, the support frame 30 further includes second positioning threaded holes (not shown) into which second positioning screws (not shown) are threadedly inserted, respectively. The lateral side 212 of the transforming substrate 21 is then stopped by the second positioning screws engaged in the second positioning threaded holes of the support frame 30.

It is to be understood that the parts of the probing device 6 will have all kinds of manufacture tolerances; therefore, these parts will need the help of the above-mentioned needle position adjusting structure 31 and the planimetric position adjusting structure 22 for alignment when they are assembled together so as to ensure that they are correctly and accurately assembled to have good function for probing the devices under test. That is, the alignment of the second substrate surface 213 of the transforming substrate 21 can be achieved by the needle position adjusting structure 31, and the alignment of the first substrate surface 210 of the transforming substrate 21 can be done by the planimetric position adjusting structure 22, achieving the effect of separate assembly of parts. Specifically speaking, the alignment between the second substrate surface 213 of the transforming substrate 21 and the probe head 32 can be realized by adjusting the position of the probe head 32 on XY plane via the needle position adjusting structure 31, thereby enhancing the assembly accuracy and the flexibility of position adjustment of the probe head 32. On the other hand, the alignment among the first substrate surface 210 of the transforming substrate 21, the electrically conductive layer 4 and the circuit board 5 can be realized by adjusting the position of the transforming substrate 21 on XY plane via the planimetric position adjusting structure 22.

Referring to FIG. 4A again, the space transformer module 2 includes a plurality of the alignment grooves 208 provided on the fourth surface 205 of the substrate frame 20 and extending in Z-axis direction. Each alignment groove 208 is received with an alignment pin 24. The alignment grooves 208 may be configured penetrating through the substrate frame 20 as disclosed in this embodiment. Alternatively, the alignment grooves 208 may not penetrate through the substrate frame 20. It will be appreciated that each side member of the substrate frame 20 is provided at the middle thereof with one alignment groove 208 in this embodiment; however, the number and locations of the alignment grooves 208 are not limited to the design in this embodiment. Each alignment pin 24 is inserted into one of the alignment grooves 208 and has a portion protruding out of the fourth surface 205. Referring to FIG. 3 again, the first support flange 301 is provided with a plurality of insertion holes 309 corresponding in location to the alignment grooves 208 of the substrate frame 20, such that the alignment pins 24 that are respectively inserted in the alignment grooves 208 extend further into the insertion holes 309 respectively, so that the transforming substrate 21 can be limited in an initial position. Of course, the number and locations of the insertion holes 309 are not limited to the design of this embodiment.

Figure 5A:
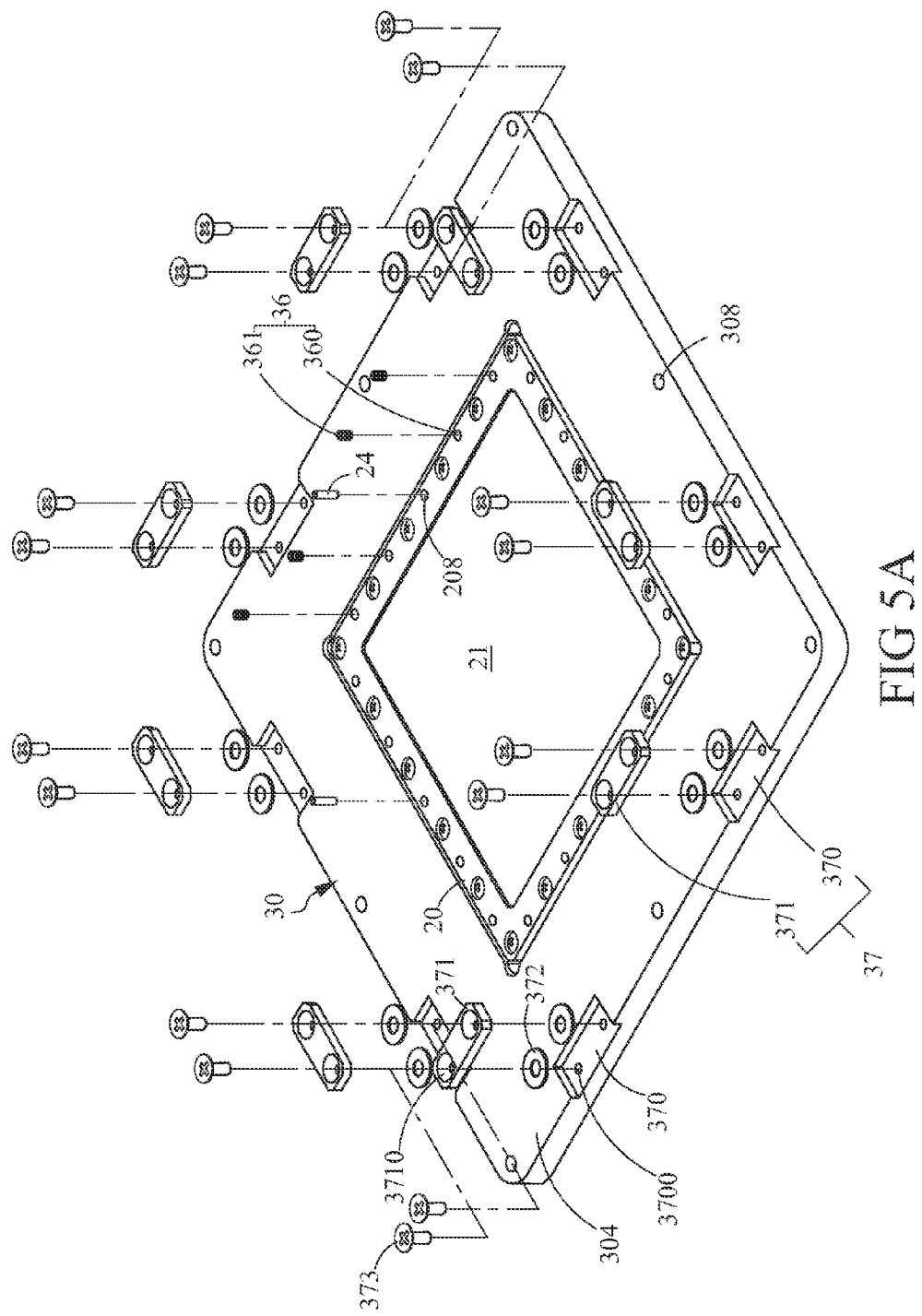
FIG. 5A is a schematic view showing that the support frame, the transforming substrate and the substrate frame are assembled and an elevation adjusting structure is explodedly illustrated.
Figure 5B:
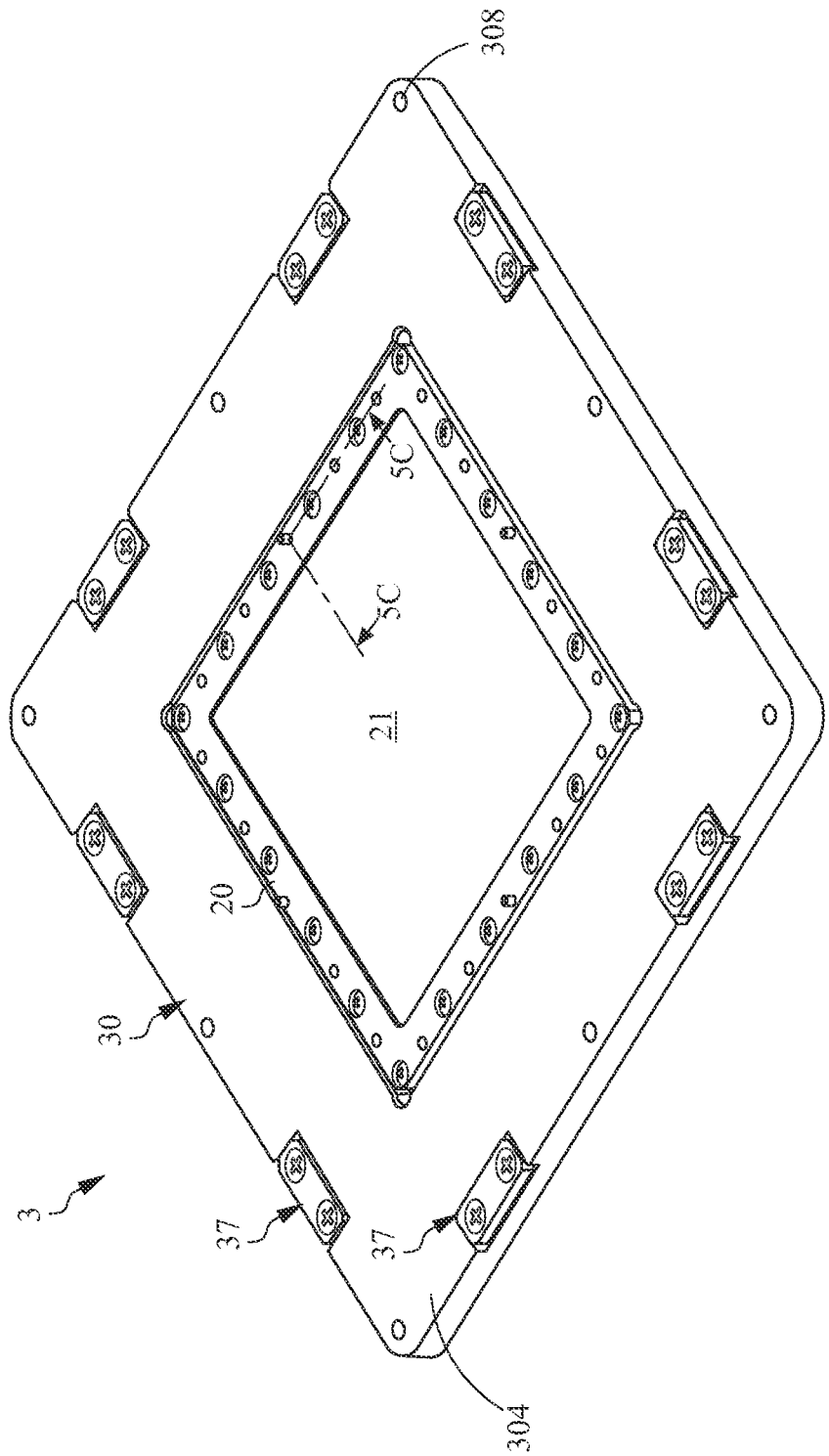
FIG. 5B is similar to FIG. 5A but showing that the elevation adjusting structure is assembled with the support frame.
Figure 5C:
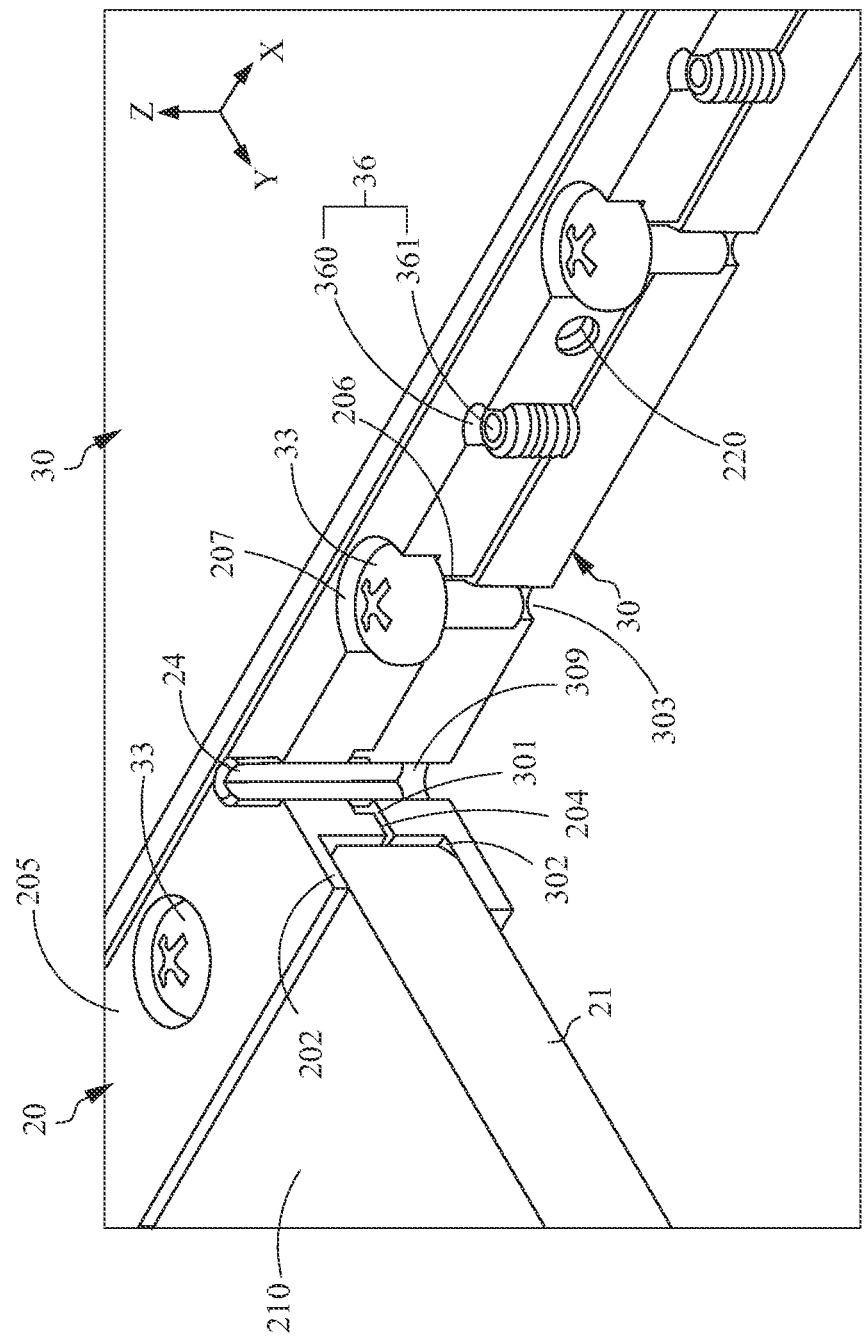
FIG. 5C is a schematic cutaway view illustrating the combination of the substrate frame, the transforming substrate and the support frame and taken along the line 5C-5C of FIG. 5B.

The elevation adjusting structure 37 and the clamp adjusting structure 36 of the position adjustable probing device 6 will be detailedly illustrated hereinafter by reference to FIGS. 5A to 5C, wherein FIG. 5A shows the elevation adjusting structure in an exploded manner, FIG. 5B shows the elevation adjusting structure in an assembled manner, and FIG. 5C is a schematic cutaway view taken along the line 5C-5C of FIG. 5B.

Referring to FIGS. 5A and 5B, the elevation adjusting structure 37 is provided at the support frame 30 for adjusting a position of the support frame 30 relative to a reference surface in an axial direction. In this embodiment, the aforesaid axial direction is the Z-axis direction, the reference surface indicates, but not limited to, the surface 51 of the circuit board 5 as shown in FIG. 2A. Referring to FIG. 5C, the clamp adjusting structure 36 is provided at the space transformer module 2 for adjusting a relative height between the support frame 30 and the substrate frame 20, i.e. a relative height between the second support flange 302 and the third support flange 202.

As shown in FIGS. 5A and 5C, the clamp adjusting structure 36 comprises a plurality of adjusting threaded holes 360 penetrating through the substrate frame 20 and aimed at and communicated with the first support flange 301 of the support frame 30, and a plurality of adjusting screws 361 each threaded into one of the adjusting threaded holes 360 and having an end stopped at the first support flange 301 of the support frame 30. In this embodiment, each side member of the substrate frame 20 is provided with several adjusting threaded holes 360; however, the number of the adjusting threaded holes 360 is determined subject to the size of the substrate frame 20 and not limited to the design of this embodiment. Further, the transforming substrate 21 is clamped between the substrate frame 20 and the support frame 30. Since the substrate frame 20 and the support frame 30 are rigid bodies made of hard material, a problem of mechanical error may occur. The role of the clamp adjusting structure 36 may ensure that the transforming substrate 21 can be firmly clamped between the substrate frame 20 and the support frame 30.

Figure 5E:
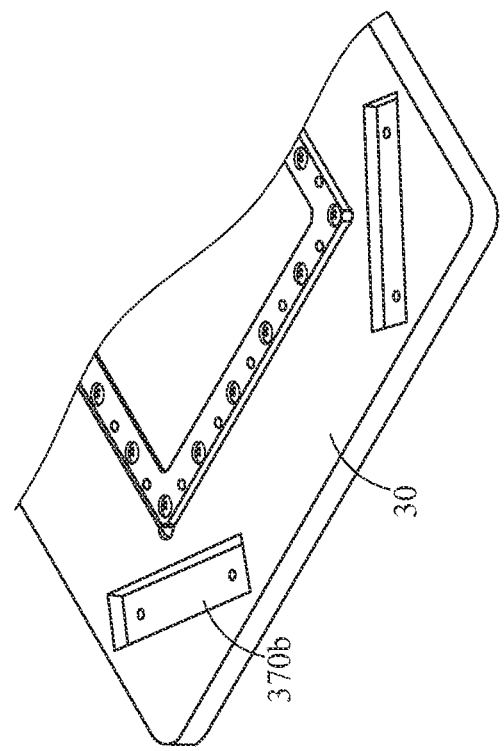
FIG. 5E is a schematic perspective view showing the recesses of the elevation adjusting structure according to still another embodiment.
Figure 5D:
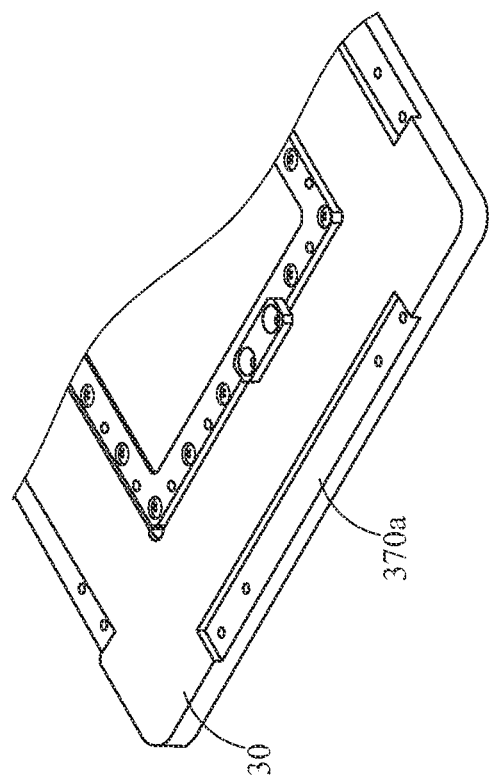
FIG. 5D is a schematic perspective view showing the recesses of the elevation adjusting structure according to another embodiment.

The elevation adjusting structure 37 comprises a plurality of recesses 370 and a plurality of press plates 371. Each recess 370 is formed on the second surface 304 and provided at a bottom surface thereof with at least one first threaded hole 3700. The support frame 30 is a rectangular frame having perpendicularly connected four side members each having two or more recesses 370. In this embodiment, the second surface 304 of each side member of the support frame 30 is provided with two recesses 370; however, the number and locations of the recesses 370 may be determined subject to the size of the support frame 30 or actual requirement and not limited to the design of this embodiment. For example, as shown in FIG. 5D, each side member of the support frame 30 is provided with one elongated recess 370a only. Further, as shown in FIG. 5E, an inclined recess 370b is provided at each corner of the support frame 30, i.e. one recess 307b inclinedly extends across each two adjacent side members of the support frame 30. Referring to FIGS. 5A to 5C again, the press plates 371 are received in the recesses 370, respectively. Each press plate 371 has at least one first through hole 3710 in alignment with the at least one first threaded hole 3700 of the associated recess 370. At least one spacer 372 is disposed between paired first through hole 3710 and first threaded hole 3700, and an elevation adjusting screw 373 is engaged in the paired first through hole 3710 and first threaded hole 3700. Specifically speaking, at least one spacer 372, such as washer shown in drawings, is disposed between each paired recess 370 and press plate 371, i.e. between the support frame 30 and the circuit board 5, and corresponds to the associated first through hole 3710 and first threaded hole 3700. The elevation adjusting screw 373 is threaded into the first threaded hole 3700 through the associated first through hole 3710 and the at least one spacer 372 in a way that each of the press plates 371 presses at least one spacer 372 in the associated recess 370. Since the spacer 372 has a certain thickness, the distance between the press plate 371 and the bottom surface of the recess 370 can be adjusted by the amount of the spacer 372. It is to be mentioned that the thickness and amount of the spacers 372 have no specific limit. In fact, they may be determined subject to actual need. Further, if a single elevation adjusting screw 373 passes through two or more spacers 372, two adjacent spacers 372 of the aforesaid two or more spacers 372 may have different thickness. It is to be understood that the spacer 372 may be installed in a manner that the elevation adjusting screw 373 does not penetrate through the spacer 372. In another embodiment of the present invention, at least one spacer 372 may be set on the bottom surface of the recess 370 between two adjacent first threaded holes 3700, and the elevation adjusting screw 373 may pass through respective first through hole 3710 and be directly threaded into respective first threaded hole 3700, such that the spacer 372 is sandwiched between the bottom surface of the recess 370 and the press plate 371 so as to lift the press plate 371 away from the bottom surface of the recess 370 at a predetermined height. In another embodiment, the spacer 372 may be realized by screw. That is, a relative height between the circuit board 5 and the transforming substrate 21 can be adjusted via the protruding shank of the screw. In still another embodiment, the spacer 372 can be directly made according to a desired height between the circuit board 5 and the transforming substrate 21. For example, the spacer 372 may be a metal block of hard stopper having a certain thickness; therefore, multiple spacers 372 are not needed for height adjustment. By means of the elevation adjusting structure 37, a relative position between the transforming substrate 21 and the circuit board 5 in a height orientation can be adjusted, thereby simplifying alignment and assembly of the transforming substrate 21 and the circuit board 5.

Figure 6A:
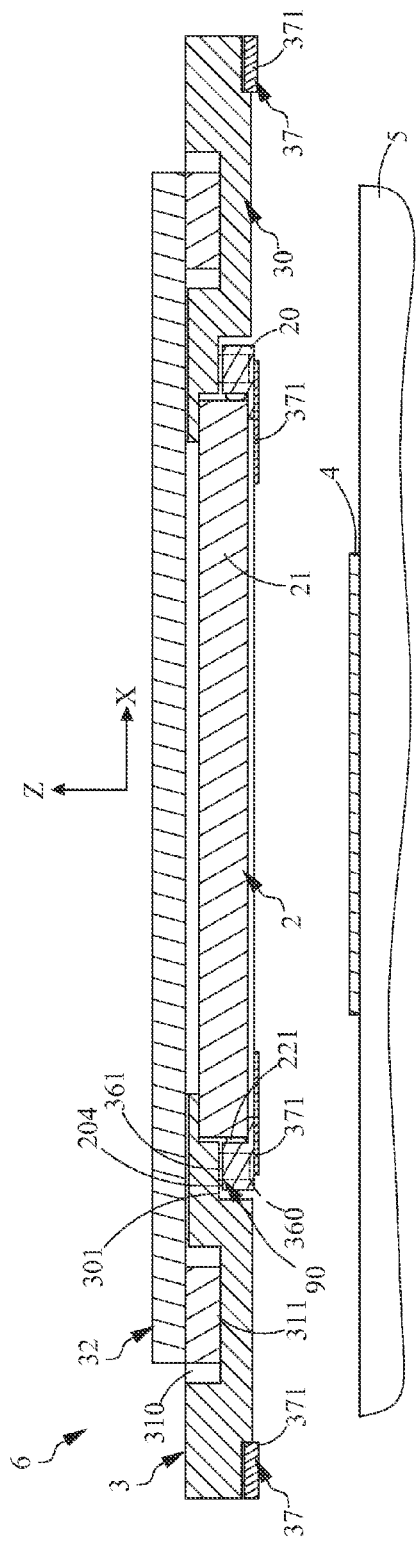
FIGS. 6A and 6B are schematically sectional views showing the clamp adjusting structure in different statuses for height adjustment.
Figure 6B:
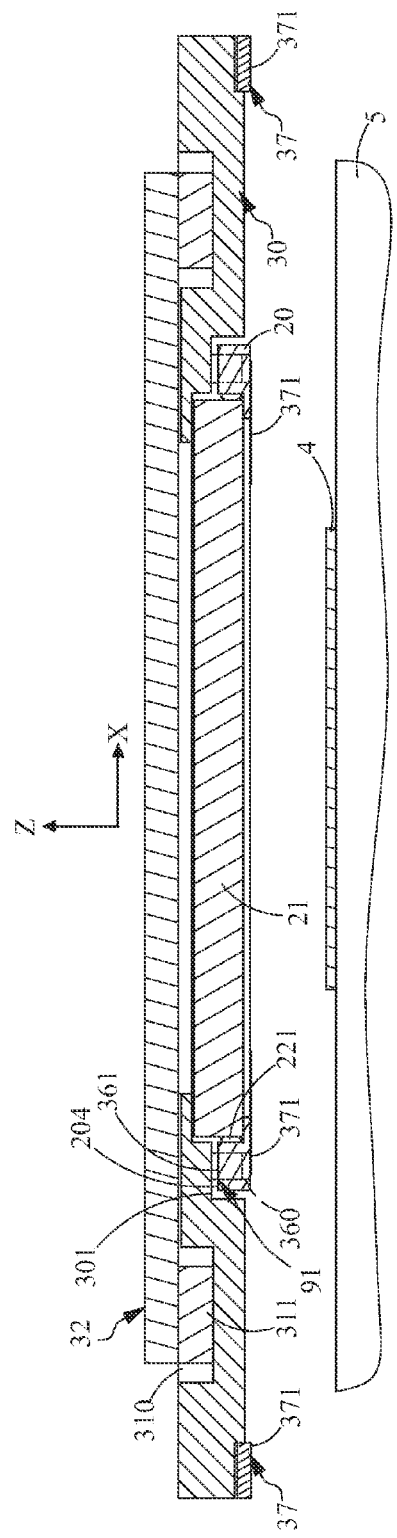

The operation of the clamp adjusting structure 36 will be detailedly given hereinafter by reference to FIGS. 6A and 6B which show the clamp adjusting structure 36 in different statuses in height adjustment. Another function of the clamp adjusting structure 36 is to adjust the gap, i.e. the height difference, between the third surface 204 of the substrate frame 20 and the first support flange 301 when the substrate frame 20 is mounted on the first support flange 301 so as to adjust the position of the substrate frame 20 in Z-axis direction, such that the relative height between the support frame 30 and the substrate frame 20 can be accordingly adjusted, i.e. the relative height between the second support flange 302 and the third support flange 202 can be adjusted. As shown in FIG. 6A, the adjusting screws 361 are stayed at a first position 90. By means of turning counterclockwise the adjusting screws 361 by tool, such as hex key or proper jig, the substrate frame 20 is driven to move downwardly from the first position 90 to a second position 91 as shown in FIG. 6B. To the contrary, if the adjusting screws 361 are turned clockwise, the substrate frame 20 will be driven to move upwardly. Further, by means of adjusting the adjusting screws 361 individually to different positions, the contained angle between the third surface 204 and the first support flange 301 or the contained angle between the third surface 204 and the XY plane can be adjusted. That is, not only the position of the substrate frame 20 in Z-axis direction but also the inclined angle of the substrate frame 20 can be adjusted by turning the adjusting screws 361 synchronously or individually. As to the relative position between the transforming substrate 21 and the circuit board 5, it can be adjusted by the second positioning screws 221 of the planimetric position adjusting structure 22, such that the pads of the transforming substrate 21 can be accurately and electrically connected with the circuit board 5 when the space transformer and probe head module 3 is fixedly mounted on the circuit board 5. Specifically speaking, the support frame 30 and the space transformer module 2 may be combinedly treated as a part of the space transformer and probe head module 3 and the probe head 32 is the other part of the space transformer and probe head module 3. When the space transformer and probe head module 3 is mounted to the circuit board 5, it can be said that the part formed of the support frame 30 and the space transformer module 2 is mounted to the circuit board, or the whole space transformer and probe head module 3 is mounted to the circuit board 5.

Figure 7A:
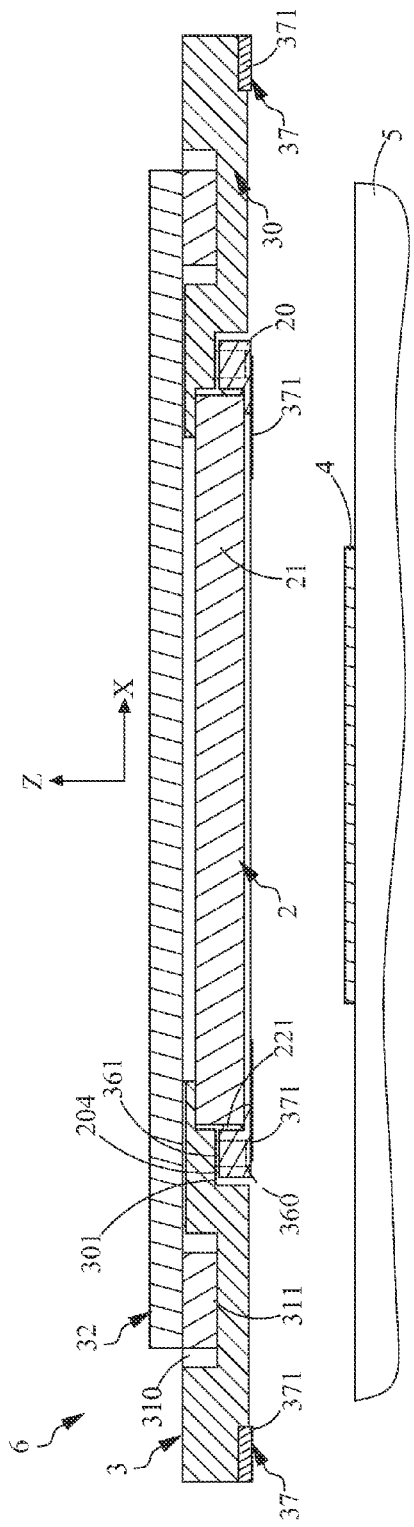
FIGS. 7A and 7B are schematically sectional views showing the elevation adjusting structure in different statuses for height adjustment.
Figure 7B:
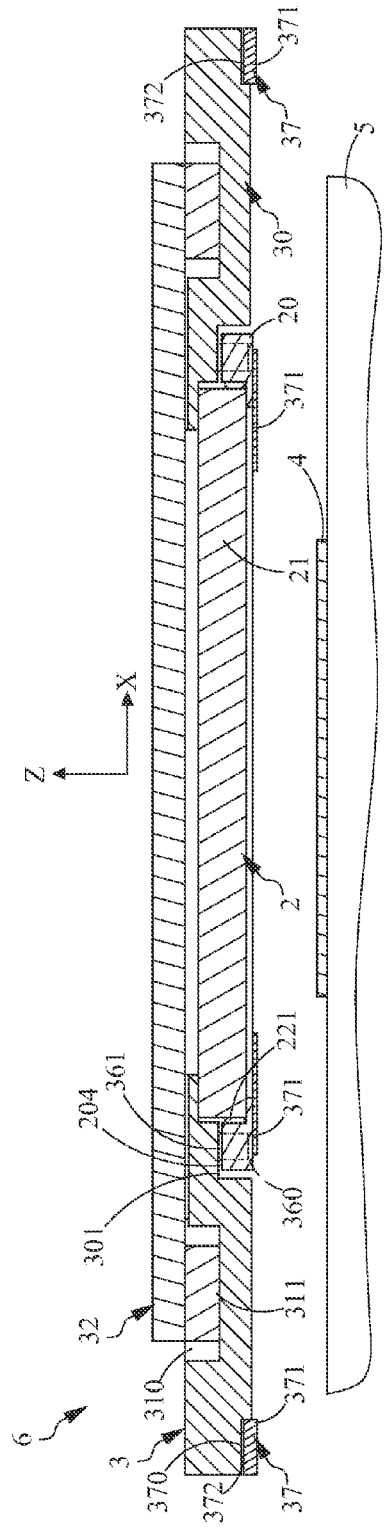

The operation of the elevation adjusting structure 37 will be detailedly illustrated hereinafter by reference to FIGS. 7A and 7B which show the elevation adjusting structure 37 in different statuses in height adjustment. The function of the elevation adjusting structure 37 is to adjust the gap, i.e. height difference, between the space transformer and probe head module 3 and the surface of the circuit board 5 so as to adjust the position of the space transformer and probe head module 3 in Z-axis direction for changing the contact relationship between the transforming substrate 21 and the electrically conductive layer 4. FIG. 7A shows a case that no spacers 372 are used in the elevation adjusting structure 37, and FIG. 7B shows that the spacer 372 is disposed between the press plate 371 and the bottom surface of the recess 370, so that the height of the transforming substrate 21 relative to the circuit board 5 will be different from that shown in FIG. 7A when the space transformer and probe head module 3 is mounted on the circuit board 5. Further, by means of putting spacers 372 of different amount and/or thickness in respective recesses 370, the contained angle between the surface of the transforming substrate 21 and the surface of the circuit board 5 can be adjusted.

In the above-mentioned embodiments, the clamp adjusting structure 36 is responsible to the adjustment of the relative height between the second support flange 302 and the third support flange 202, i.e. fine tune of the relative position therebetween in Z-axis direction. The elevation adjusting structure 37 is responsible to the relative height between the space transformer and probe head module 3 and the circuit board 5 in Z-axis direction. It is to be mentioned that both of the clamp adjusting structure 36 and the elevation adjusting structure 37 are provided in the probing device 6 disclosed in above-mentioned embodiments at the same time; however, the clamp adjusting structure 36 or the elevation adjusting structure 37 can be selectively and solely implemented in the probing device 6 according to actual need for achieving the purpose of height adjustment.

Further, the elevation adjusting structure 37 can also adjust the horizontal level of the space transformer and probe head module 3, and the spacers 35 of the needle position adjusting structure 31 can be used to adjust not only the position of the probe head 32 in Z-axis direction but also the horizontal level of the probe head 32. By means of the elevation adjusting structure 37 and/or the spacers 35 of the needle position adjusting structure 31, the tips of probe needles of the probe head 32 can be positively and accurately contacted with the electric contacts of the device under test when the device under test is probed by the probing device 6 of the present invention.

Furthermore, no matter whether the space transformer module 2 has the function of adjusting the planimetric position of the transforming substrate 21, the height and/or the horizontal level of the spacer transformer module 2 relative to the circuit board 5 can be achieved by the spaces 372 disposed between the support frame 30 and the circuit board 5. Besides, the height and/or the horizontal level of the probe head 32 relative to the space transformer module 2 can be achieved by the spaces 35 disposed between the support frame 30 and the probe head 32.

In conclusion, because the parts of the position adjustable probing device 6 and the probe card assembly using the same provided by the present invention need not to be orderly aligned one after another and assembled on or disassembled from the circuit board 5 during repair or replace work, the position adjustable probing device 6 and the probe card assembly using the same can save time in assembly or disassembly and have the advantage of convenience in dismantling. For example, the space transformer module 2 can be detached from the circuit board 5, or the probe head 32 can be detached from the support frame 30. In addition, the transforming substrate 21 can be maintained in a fixed elevation by the elevation adjusting structure 37, such that the transforming substrate 21 can be cooperated with different circuit boards.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probing device for being mounted to a circuit board, the probing device comprising:
   a frame having a first surface, a second surface opposite to the first surface, and a first opening penetrating through the first and second surfaces;
   a probe head coupled to the frame;
   an elevation adjusting structure provided at the frame and having a plurality of spacers for adjusting a position of the frame relative to a surface of the circuit board in an axial direction; and
   a space transformer module disposed in the first opening of the frame and detachedly and electrically connected with the probe head and the circuit board in a way that the second surface of the frame faces the circuit board and the first surface faces the probe head;
   wherein the space transformer module comprises:
   a substrate frame having a second opening, an inner periphery wall surrounding around the second opening, and an outer periphery wall;
   a transforming substrate disposed in the second opening of the substrate frame; and
   a planimetric position adjusting structure comprising:
      a plurality of second positioning threaded holes each penetrating through the substrate frame from the outer periphery wall to the inner periphery wall; and
      a plurality of second positioning screws each threaded into one of the second positioning threaded holes and having an end stopped at a lateral side of the transforming substrate for adjusting a transforming substrate on a plane.

2. The probing device as claimed in claim 1, wherein the frame is a support frame; the elevation adjusting structure further comprises:
   a plurality of recesses provided at the second surface of the support frame and each having at least one first threaded hole;
   a plurality of press plates received in the recesses respectively and each having at least one first through hole in alignment with the at least one first threaded hole of associated said recess; and
   a plurality of elevation adjusting screws respectively threaded into the first threaded holes through the first through holes in a way that each of the press plates presses at least one of the spacers in associated said recess.

3. The probing device as claimed in claim 1, wherein the space transformer module further comprises a clamp adjusting structure for adjusting a relative height between the support frame and the space transformer module; the clamping adjusting structure comprises:
   a plurality of adjusting threaded holes penetrating through the substrate frame and aimed at a first support flange that extends from an inner periphery wall surrounding around the first opening of the support frame and supports thereon the space transformer module; and a plurality of adjusting screws each threaded into one of the adjusting threaded holes and having an end stopped at the first support flange of the support frame.

4. The probing device as claimed in claim 3, further comprising a needle position adjusting structure comprising:
at least one adjusting groove recessed on the first surface of the support frame;
at least one mounting member received in the at least one adjusting groove and connected with the probe head;
a plurality of first positioning threaded hole each extending from an outer periphery wall of the support frame to the at least one adjusting groove and being communicated with the at least one adjusting groove; and
a plurality of first positioning screws each threaded into one of the first positioning threaded holes and having an end stopped at a lateral side of the at least one mounting member.

5. The probing device as claimed in claim 4, wherein at least one spacer is disposed between the at least one mounting member and the at least one adjusting groove.

6. The probing device as claimed in claim 2, wherein the support frame is a rectangular frame having four side members each provided with at least one said recess of the elevation adjusting structure.

7. The probing device as claimed in claim 1, wherein the frame is a support frame having an inner periphery wall surrounding around the first opening, a first support flange extending from the inner periphery of the support frame, and a second support flange extending from the first support flange; the substrate frame further comprises a third support flange extending from the inner periphery wall of the substrate frame; the transforming substrate has a first substrate surface supported on the third support flange, and a second substrate surface opposite to the first substrate surface and corresponding to the second support flange.

8. The probing device as claimed in claim 7, wherein the substrate frame is provided at a third surface that faces the support frame with a plurality of alignment grooves; each of the alignment groove is inserted with an alignment pin.

9. The probing device as claimed in claim 8, wherein the first support flange of the support frame has a plurality of insertion holes aimed at the alignment grooves of the substrate frame one by one; the alignment pins extend into the insertion holes, respectively.

10. The probing device as claimed in claim 7, wherein the space transformer module further comprises a clamp adjusting structure for adjusting a relative height between the second support flange of the support frame and the third support flange of the substrate frame; the clamping adjusting structure comprises:
a plurality of adjusting threaded holes penetrating through the substrate frame and aimed at the first support flange; and
a plurality of adjusting screws each threaded into one of the adjusting threaded holes and having an end stopped at the first support flange of the support frame.

11. The probing device as claimed in claim 1, wherein the transforming substrate is a space transformer selected from the group consisting of a multi-layered ceramic member, a multi-layered organic member, a multi-layered silicon member, a combination of a multi-layered ceramic member and a multi-layered organic member, and a combination of a multi-layered ceramic member and a flexible printed circuit board.

12. The probing device as claimed in claim 2, further comprising a needle position adjusting structure comprising:
at least one adjusting groove recessed on the first surface of the support frame;
at least one mounting member received in the at least one adjusting groove and connected with the probe head;
a plurality of first positioning threaded hole each extending from an outer periphery wall of the support frame to the at least one adjusting groove and being communicated with the at least one adjusting groove; and
a plurality of first positioning screws each threaded into one of the first positioning threaded holes and having an end stopped at a lateral side of the at least one mounting member.

13. The probing device as claimed in claim 12, wherein at least one spacer is disposed between the at least one mounting member and the at least one adjusting groove.

14. The probing device as claimed in claim 12, wherein the at least one mounting member is a polygonal frame or an arc-shaped frame, and the at least one adjusting groove has a shape corresponding to that of the at least one mounting member.

15. A probe card assembly comprising:
a support frame having a first surface, a second surface opposite to the first surface, and a first opening penetrating through the first and second surfaces;
a space transformer module having a space transformer disposed in the first opening of the support frame;
a circuit board supporting the support frame and being electrically connected with the space transformer in a way that the circuit board faces the second surface of the support frame;
an elevation adjusting structure having a plurality of spacers disposed between the support frame and the circuit board for adjusting a height of the support frame relative to the circuit board;
a probe head supported on the support frame and electrically connected with the space transformer in a way that the probe head faces the first surface of the support frame; and
a needle position adjusting structure having a plurality of spacers disposed between the support frame and the probe head for adjusting a height of the probe head relative to the support frame;
wherein the space transformer module comprises:
a substrate frame having a second opening, an inner periphery wall surrounding around the opening, and an outer periphery wall;
the space transformer disposed in the second opening of the substrate frame; and
a planimetric position adjusting structure comprising:
a plurality of second positioning threaded holes each penetrating through the substrate frame from the outer periphery wall to the inner periphery wall; and
a plurality of second positioning screws each threaded into one of the second positioning threaded holes and having an end stopped at a lateral side of the space transformer for adjusting a position of the space transformer substrate on a plane.

16. The probe card assembly as claimed in claim 15, wherein the elevation adjusting structure further comprises a plurality of recesses provided at the second surface of the support frame; each of the recesses is received with at least one press plate that is in contact with the circuit board, at least one of the spacers of the elevation adjusting structure pressed by the at least one press plate, and at least one elevation adjusting screw penetrating through the at least one press plate and being threaded into the support frame.

* * * * *